United States Patent
Anderson et al.

(10) Patent No.: US 12,439,660 B2
(45) Date of Patent: Oct. 7, 2025

(54) VERTICAL TRANSISTOR WITH REDUCED CELL HEIGHT

(71) Applicant: INTERNATIONAL BUSINESS MACHINES CORPORATION, Armonk, NY (US)

(72) Inventors: Brent A. Anderson, Jericho, VT (US); Ruilong Xie, Niskayuna, NY (US); Albert M. Chu, Nashua, NH (US); Hemanth Jagannathan, Niskayuna, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 18/060,603

(22) Filed: Dec. 1, 2022

(65) Prior Publication Data

US 2024/0186375 A1   Jun. 6, 2024

(51) Int. Cl.
| | | |
|---|---|---|
| *H10D 62/10* | (2025.01) | |
| *H01L 23/528* | (2006.01) | |
| *H10D 30/62* | (2025.01) | |
| *H10D 30/63* | (2025.01) | |

(Continued)

(52) U.S. Cl.
CPC ....... *H10D 62/127* (2025.01); *H01L 23/5283* (2013.01); *H10D 30/6211* (2025.01); *H10D 30/63* (2025.01); *H10D 64/512* (2025.01); *H10D 84/853* (2025.01)

(58) Field of Classification Search
CPC .. H10D 62/127; H10D 30/6211; H10D 30/63; H10D 64/512; H10D 84/853; H10D 30/6728; H10D 30/797; H10D 30/025; H10D 62/822; H10D 62/151; H10D 84/0186; H10D 84/0195; H10D 84/038; H01L 23/5283
See application file for complete search history.

(56) References Cited

U.S. PATENT DOCUMENTS

| | | | |
|---|---|---|---|
| 8,679,924 B2 | 3/2014 | Wei | |
| 8,835,936 B2 | 9/2014 | Hoentschel | |
| 9,960,256 B2 * | 5/2018 | Bouche | H10D 48/30 |

(Continued)

FOREIGN PATENT DOCUMENTS

| | | |
|---|---|---|
| EP | 3943443 A1 | 1/2022 |
| EP | 39434431 A | 1/2022 |
| WO | 2015094305 A1 | 6/2015 |

OTHER PUBLICATIONS

Vardi et al., "Self-Aligned InGaAs FinFETs with 5-nm Fin-Width and 5-nm Gate-Contact Separation", Accessed on Jun. 14, 2022, MIT Open Access Articles, 5 pages.

(Continued)

*Primary Examiner* — Khaja Ahmad
*Assistant Examiner* — Khatib A Rahman
(74) *Attorney, Agent, or Firm* — L. Jeffrey Kelly

(57) ABSTRACT

A semiconductor structure including a vertical semiconductor channel region, a bottom source drain region arranged on a substrate at a bottom of the vertical semiconductor channel region, a metal gate disposed around the vertical semiconductor channel region, where a first portion of the metal gate extends above the vertical semiconductor channel region, and a gate contact entirely above the vertical semiconductor channel region.

16 Claims, 13 Drawing Sheets

SECTION Y₁-Y₁

(51) Int. Cl.
 *H10D 64/27* (2025.01)
 *H10D 84/85* (2025.01)

(56) References Cited

U.S. PATENT DOCUMENTS

| | | | |
|---|---|---|---|
| 10,103,247 B1 * | 10/2018 | Xie | H10D 64/513 |
| 10,559,685 B2 * | 2/2020 | Li | H10D 30/6737 |
| 2016/0307892 A1 * | 10/2016 | Cheng | H10D 30/025 |
| 2019/0386135 A1 * | 12/2019 | Li | H10D 84/85 |
| 2021/0249411 A1 * | 8/2021 | Liao | H01L 21/76895 |
| 2021/0305381 A1 | 9/2021 | Chiang | |
| 2021/0391421 A1 | 12/2021 | Chu | |
| 2022/0037314 A1 | 2/2022 | Liaw | |
| 2022/0077302 A1 | 3/2022 | Subramanian | |
| 2022/0157722 A1 * | 5/2022 | Bouche | H01L 23/5283 |
| 2022/0190129 A1 * | 6/2022 | Wei | H01L 21/76895 |

OTHER PUBLICATIONS

Veloso et al., "Vertical Nanowire FET Integration and Device Aspects", Accessed on Jun. 13, 2022, 12 pages.
Pending U.S. Appl. No. 18/060,608, filed Dec. 1, 2022, entitled: "Vertical Transistor With Reduced Cell Height", 41 pages.

\* cited by examiner

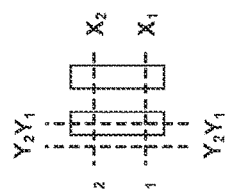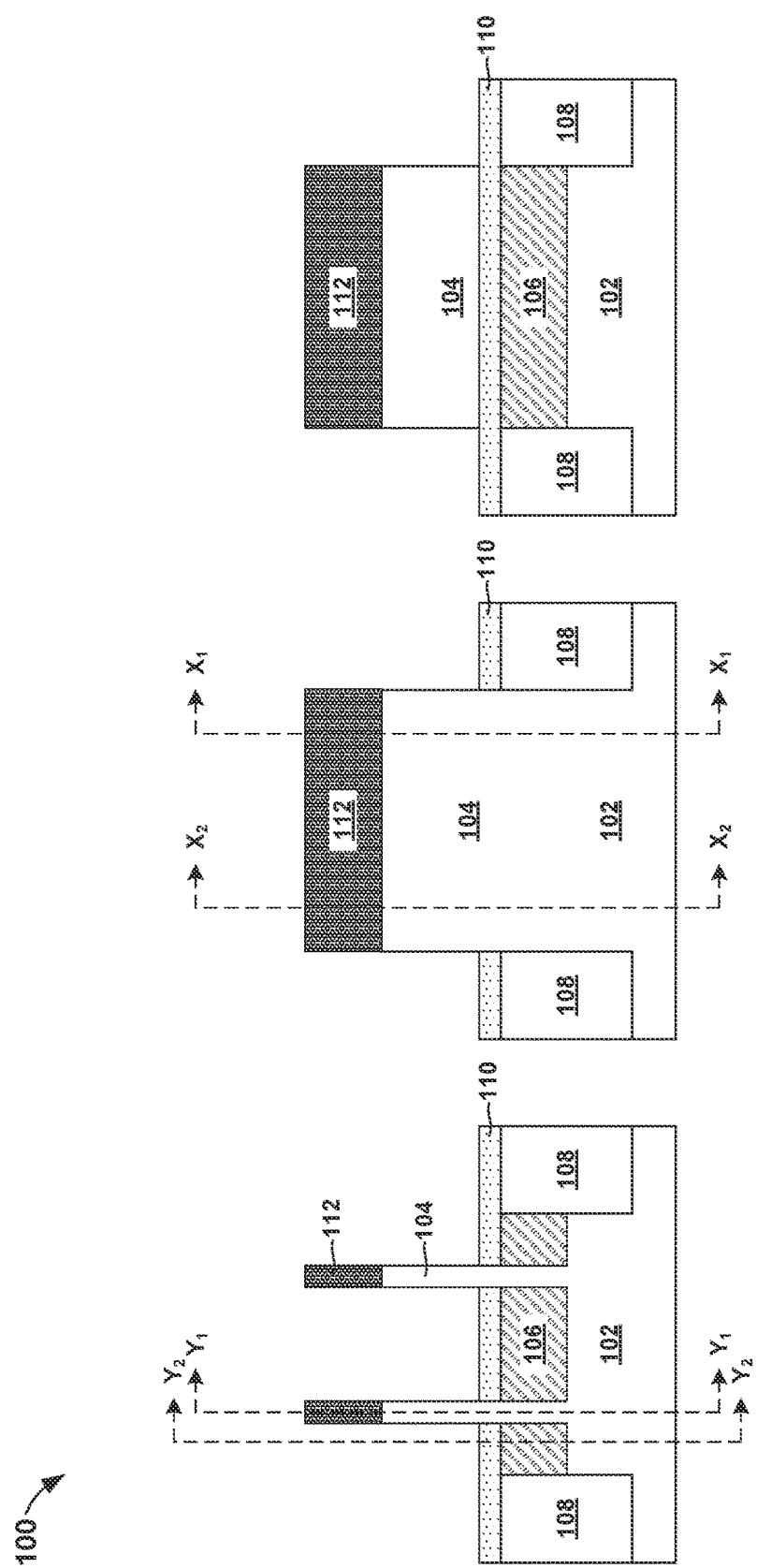
FIG. 1 SECTION X₁-X₁
FIG. 2 SECTION Y₁-Y₁
FIG. 3 SECTION Y₂-Y₂

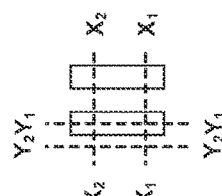
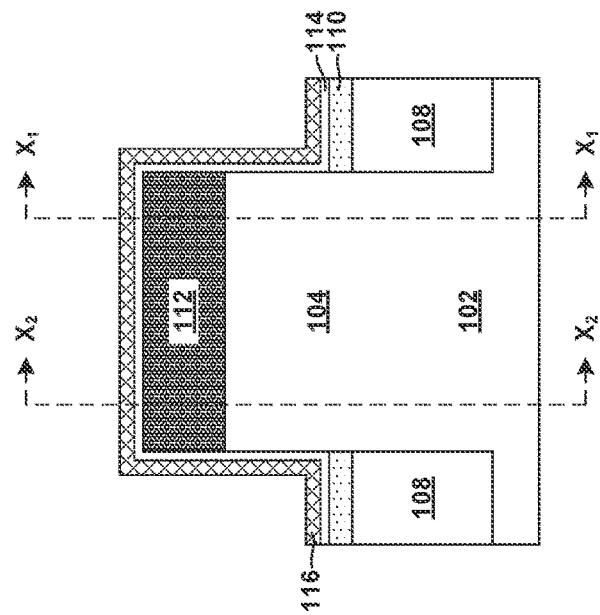
FIG. 5
SECTION $Y_1$-$Y_1$
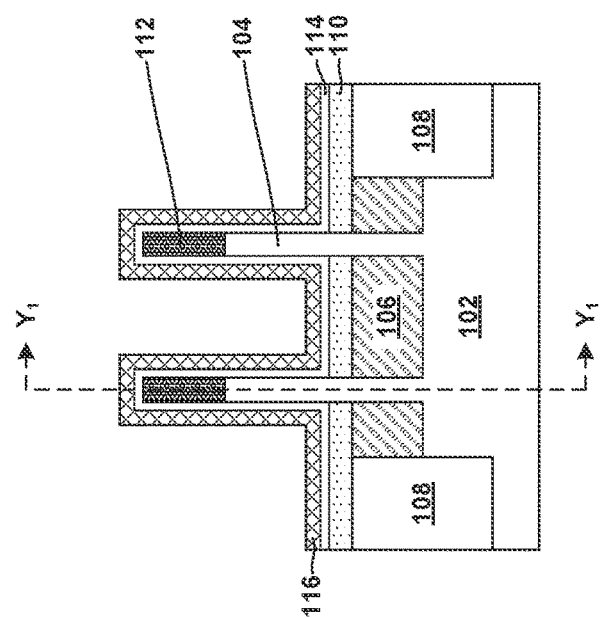
FIG. 4
SECTION $X_1$-$X_1$

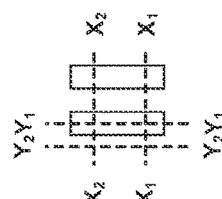
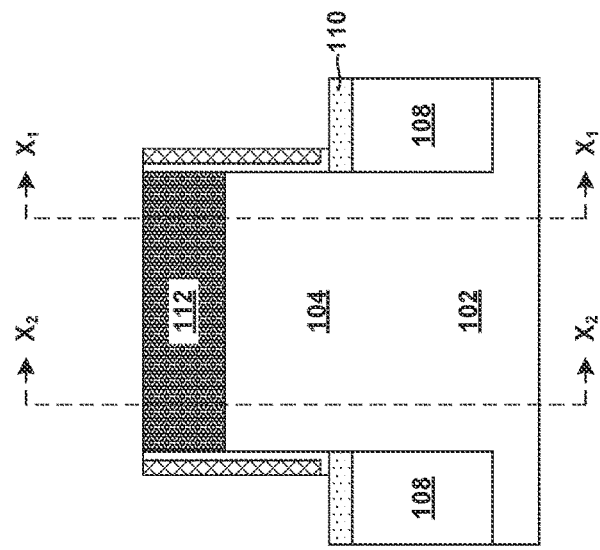
FIG. 7
SECTION $Y_1$-$Y_1$
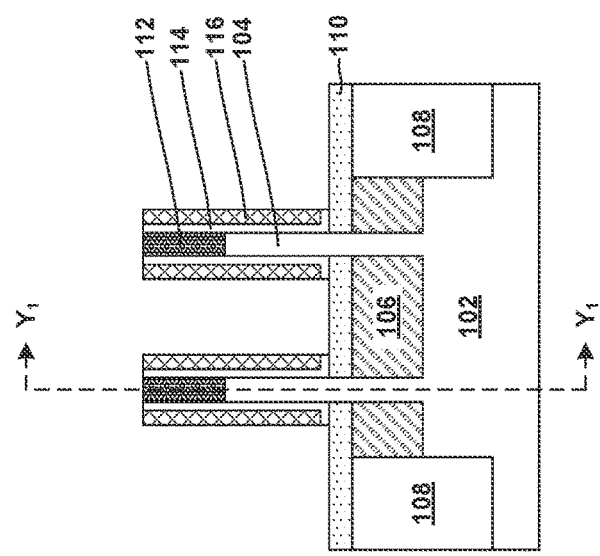
FIG. 6
SECTION $X_1$-$X_1$

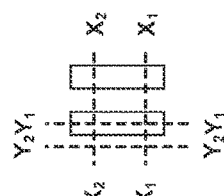
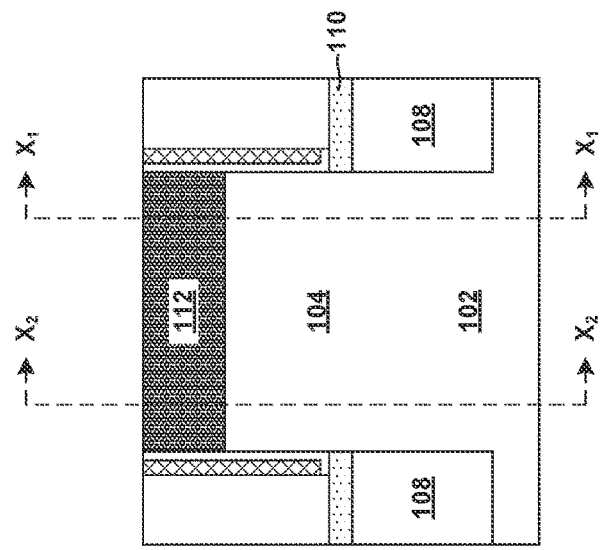
FIG. 9
SECTION Y₁-Y₁
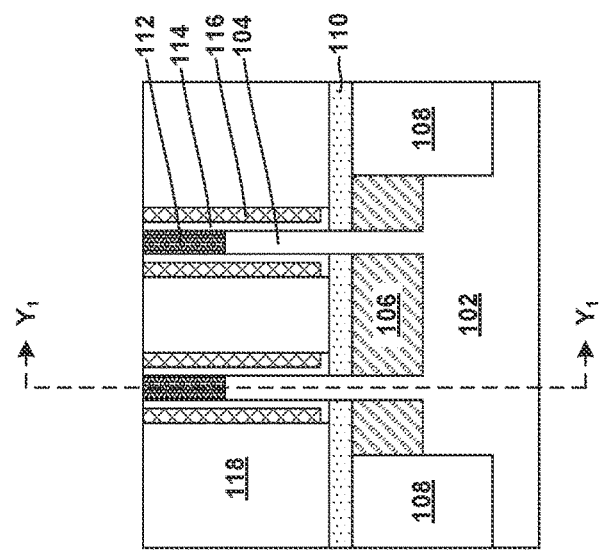
FIG. 8
SECTION X₁-X₁

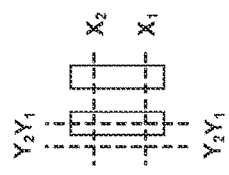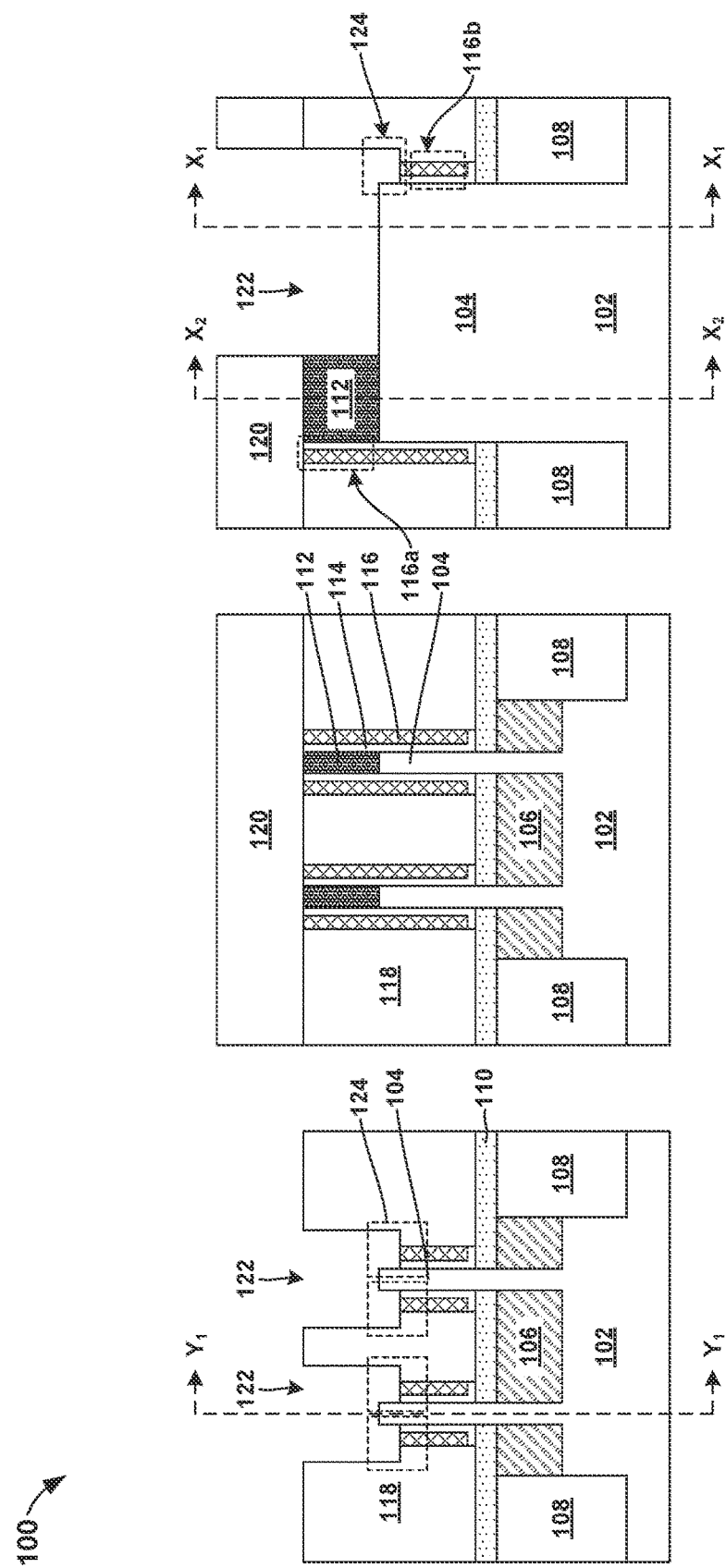
FIG. 10 SECTION $X_1$-$X_1$
FIG. 11 SECTION $X_2$-$X_2$
FIG. 12 SECTION $Y_1$-$Y_1$

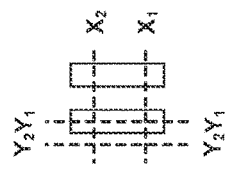
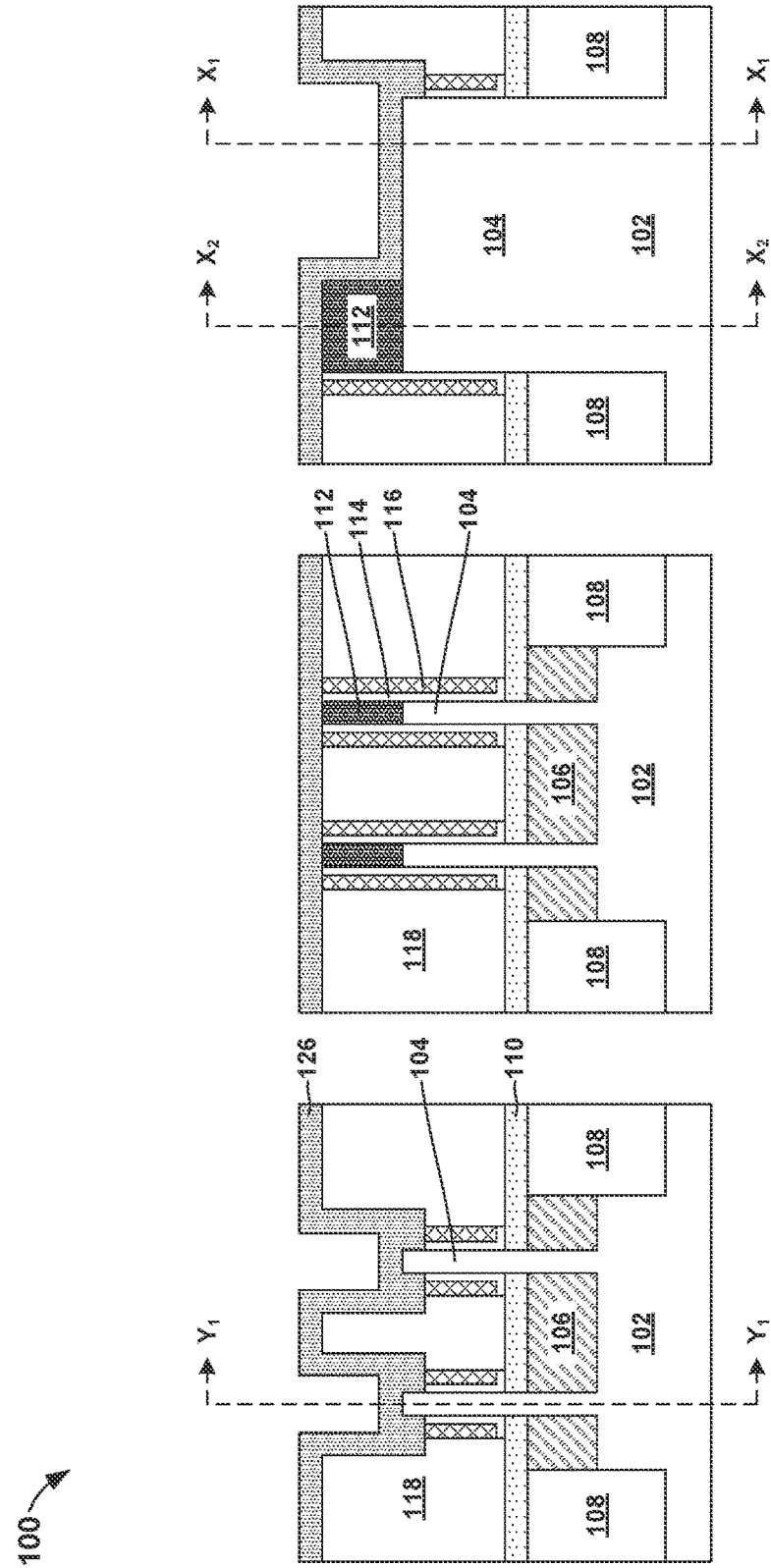
FIG. 13 SECTION X₁-X₁
FIG. 14 SECTION X₂-X₂
FIG. 15 SECTION Y₁-Y₁

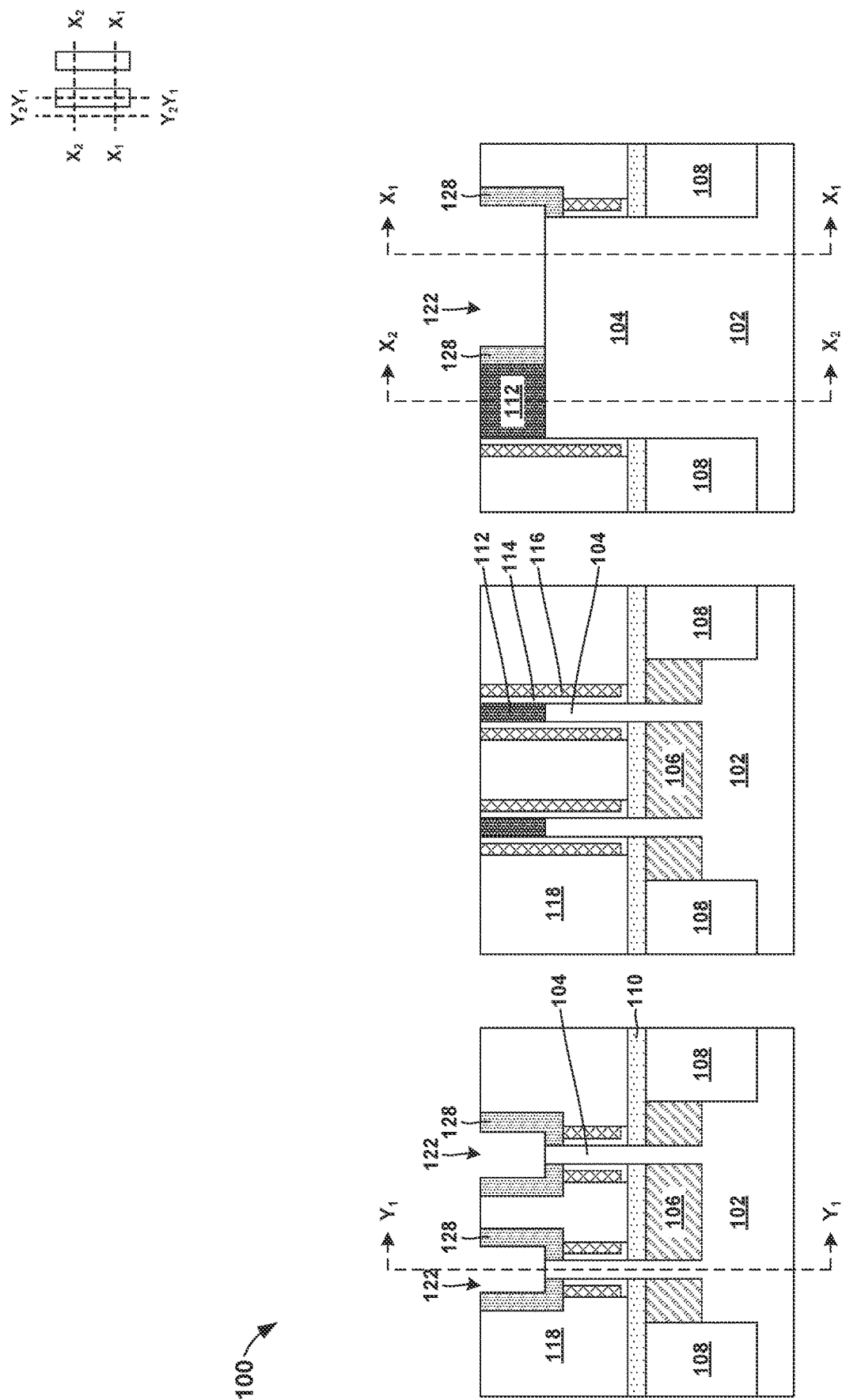

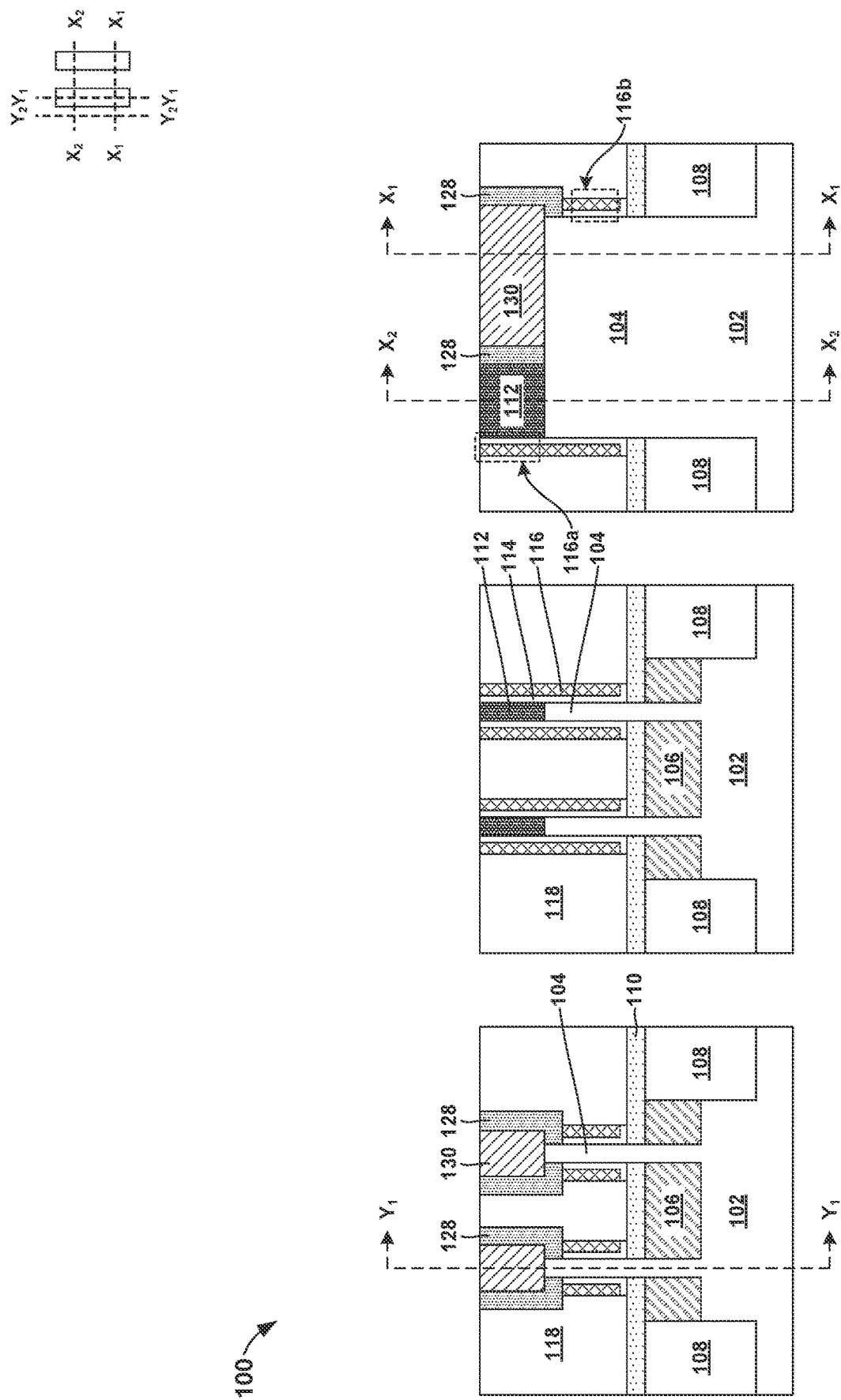

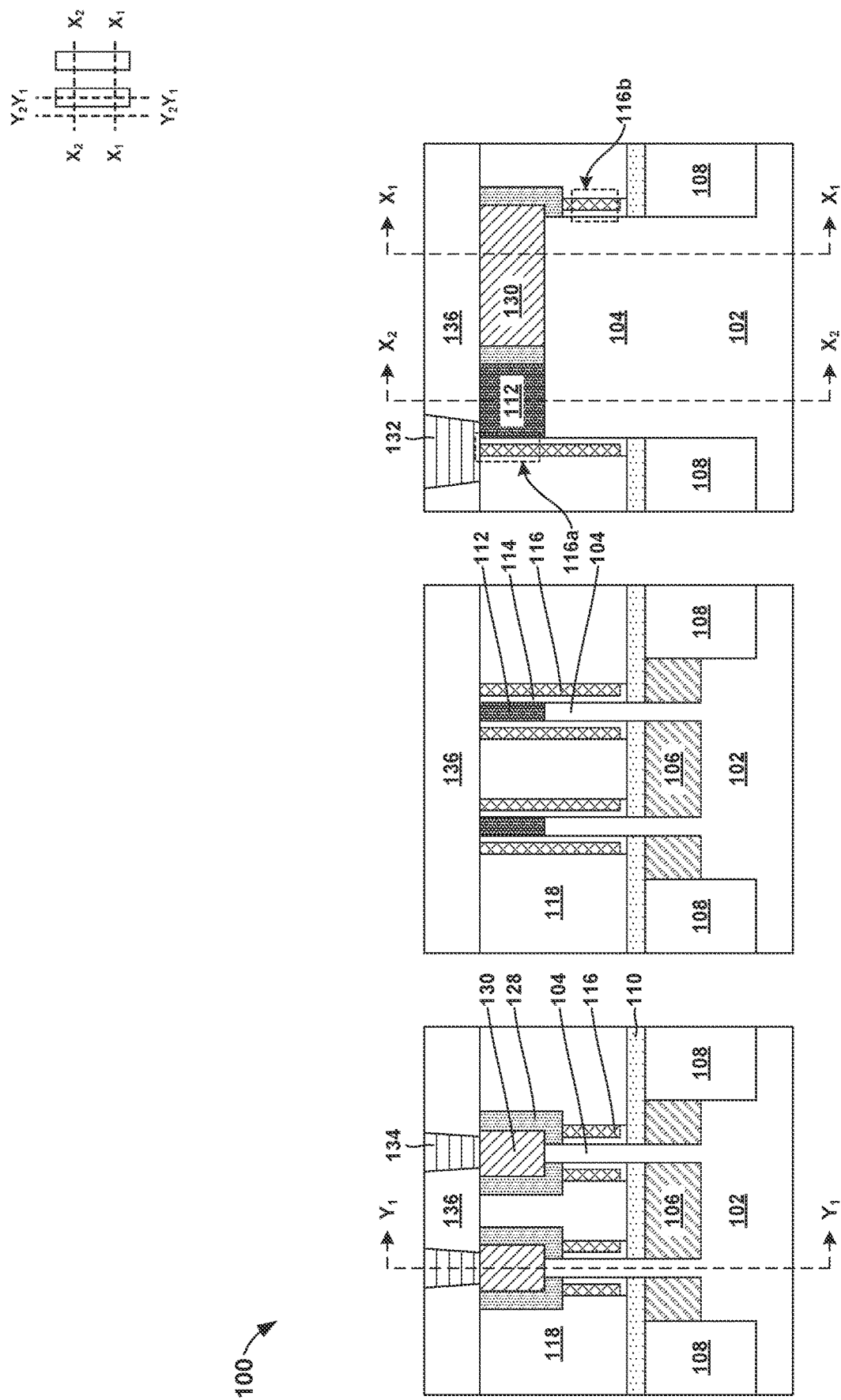

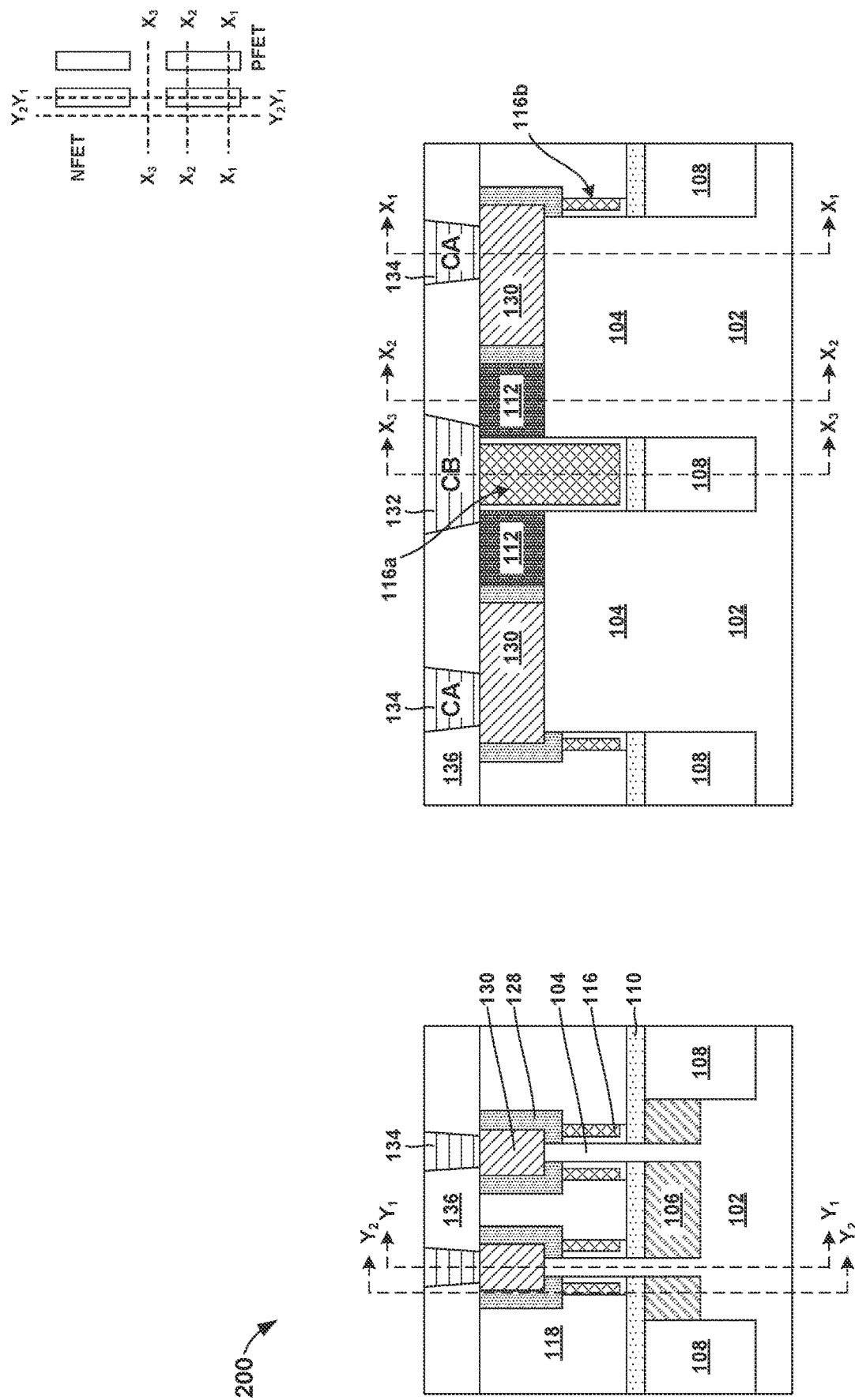

SECTION $X_2$-$X_2$

SECTION $X_3$-$X_3$

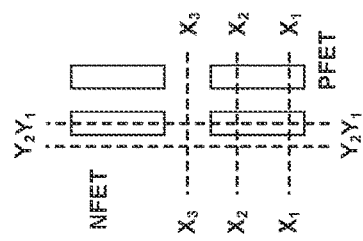
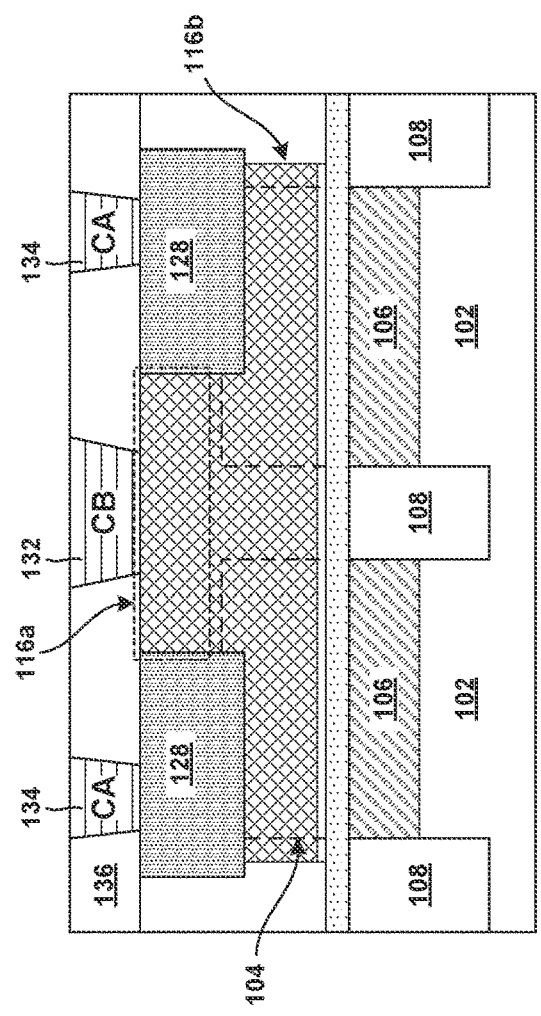
FIG. 29
SECTION Y₂-Y₂

VERTICAL TRANSISTOR WITH REDUCED CELL HEIGHT

BACKGROUND

The present invention generally relates to semiconductor structures, and more particularly to a vertical transistor having a reduced cell height.

Vertical transistors are an attractive option for technology scaling for 5 nm and beyond technologies. Vertical transistors have a channel oriented perpendicular to the substrate surface, as opposed to being situated along the plane of the surface of the substrate in the case of a lateral transistor. By using a vertical design, it is possible to increase packing density. That is, by having the channel perpendicular to the substrate, vertical transistors improve the scaling limit beyond lateral transistors.

SUMMARY

According to an embodiment of the present invention, a semiconductor structure is provided. The semiconductor structure may include a vertical semiconductor channel region, a bottom source drain region arranged on a substrate at a bottom of the vertical semiconductor channel region, a metal gate disposed around the vertical semiconductor channel region, where a first portion of the metal gate extends above the vertical semiconductor channel region, and a gate contact entirely above the vertical semiconductor channel region.

According to an embodiment of the present invention, a semiconductor structure is provided. The semiconductor structure may include a vertical semiconductor channel region, a bottom source drain region arranged on a substrate at a bottom of the vertical semiconductor channel region, a metal gate disposed around the vertical semiconductor channel region, and a top source drain region above the vertical semiconductor channel region, where a topmost surface of the metal gate is higher than the top spacer and higher than the top source drain.

According to an embodiment of the present invention, a semiconductor structure is provided. The semiconductor structure may include two vertical semiconductor channel regions aligned and arrange end-to-end with one another, a bottom source drain region arranged on a substrate at a bottom of each of two the vertical semiconductor channel regions, a metal gate disposed around the two vertical semiconductor channel regions, where a first portion of the metal gate situated between the two vertical semiconductor channel regions extends above the vertical semiconductor channel regions, and a single gate contact entirely above the vertical semiconductor channel regions.

BRIEF DESCRIPTION OF THE DRAWINGS

The following detailed description, given by way of example and not intended to limit the invention solely thereto, will best be appreciated in conjunction with the accompanying drawings, in which:

FIGS. 1, 2, and 3 are cross-sectional views of a semiconductor structure during an intermediate step of a method of fabricating a vertical transistor with reduced cell height according to an exemplary embodiment;

FIGS. 4 and 5 are cross-sectional views of the semiconductor structure after depositing a gate dielectric and metal gate according to an exemplary embodiment;

FIGS. 6 and 7 are cross-sectional views of the semiconductor structure after removing portions of the metal gate and the gate dielectric according to an exemplary embodiment;

FIGS. 8 and 9 are cross-sectional views of the semiconductor structure after forming an interlevel dielectric layer according to an exemplary embodiment;

FIGS. 10, 11, and 12 are cross-sectional views of the semiconductor structure shown after patterning a photoresist layer according to an exemplary embodiment;

FIGS. 13, 14, and 15 are cross-sectional views of the semiconductor structure shown after removing the photoresist layer and forming a dielectric layer according to an exemplary embodiment;

FIGS. 16, 17, and 18 are cross-sectional views of the semiconductor structure after removing portions of the dielectric layer according to an exemplary embodiment;

FIGS. 19, 20, and 21 are cross-sectional views of the semiconductor structure after forming top source drain regions according to an exemplary embodiment;

FIGS. 22, 23, and 24 are cross-sectional views of the semiconductor structure shown after forming contact structures including gate contacts and top source drain contacts according to an exemplary embodiment;

FIGS. 25, 26, 27, 28, and 29 are cross-sectional views of a semiconductor structure during an intermediate step of a method of fabricating a vertical transistor with reduced cell height according to an alternative embodiment.

Figure 27:
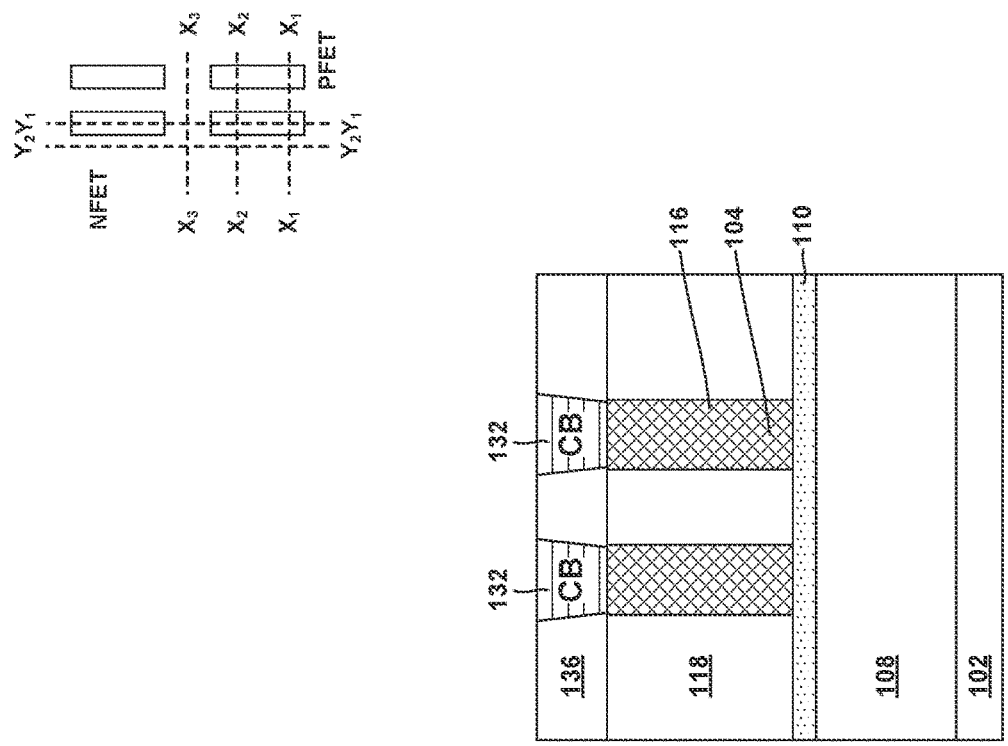

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Vertical transport FETs (VTFET) have known advantages over conventional FinFETs in terms of density, performance, power consumption, and integration. However, device density continues to be a limiting factor. For example, tall gate contacts typical of vertical devices generally have relatively small lateral dimensions at the bottom resulting in relatively high resistance. Further, overlay issues can result in short circuits between the gate contacts and top source drain regions. Embodiments of the present invention propose a new, shorter, gate contact to reduce resistance and overly issues.

The present invention generally relates to semiconductor structures, and more particularly to a vertical transistor structure with a reduced cell height. More specifically, the vertical transistor structure disclosed herein includes a raised gate structure and a gate contact positioned at a height above the fin region. Doing so allows end-to-end spacing between adjacent fins to be less than if the gate contact were to be positioned between the adjacent fins. Shrinking the end-to-end distance between adjacent fins reduces the overall cell height without reducing the length of individual fins. Embodiments of the present invention propose a raised gate structure and a gate contact positioned at a height above the fin region to achieve the reduced end-to-end spacing. Exemplary embodiments of a vertical transistor structure with a reduced cell height are described in detail below by referring to the accompanying drawings in FIGS. 1 to 31. Those skilled in the art will readily appreciate that the detailed description given herein with respect to these figures is for explanatory purposes as the invention extends beyond these limited embodiments.

Referring now to FIGS. 1, 2, and 3, a structure 100 is shown during an intermediate step of a method of fabricating a vertical transistor with a reduced cell height according to an embodiment of the invention. FIG. 1 depicts a cross-sectional view of the structure 100 shown in FIG. 2 taken along line $X_1$-$X_1$, FIG. 2 depicts a cross-sectional view of the structure 100 shown in FIG. 1 taken along line $Y_1$-$Y_1$, and FIG. 3 depicts a cross-sectional view of the structure 100 shown in FIG. 1 taken along line $X_2$-$X_2$. Some cross sections are omitted throughout the description for brevity.

The structure 100 illustrated in FIGS. 1-3 includes a semiconductor substrate 102 (hereinafter "substrate"), semiconductor fins 104, bottom source drain regions 106, shallow trench isolation regions 108 (hereinafter "STI regions"), and a bottom spacer 110 formed thereon.

The substrate 102 is shown and may be formed from any appropriate material including. e.g., bulk semiconductor or a semiconductor-on-insulator layered structure. Illustrative examples of suitable materials for the substrate 102 include, but are not limited to, silicon, silicon germanium, carbon doped silicon germanium, carbon doped silicon, epitaxial silicon, and multi-layers thereof. Although silicon is the predominantly used semiconductor material in wafer fabrication, alternative semiconductor materials can be employed, such as, but not limited to, gallium arsenide, indium phosphide, indium gallium arsenide, indium arsenide, gallium, cadmium telluride and zinc selenide.

In the present embodiment, the substrate 102 is a bulk semiconductor substrate. By "bulk" it is meant that the semiconductor substrate 102 is entirely composed of at least one of the above materials listed above. In an embodiment, the substrate 102 can be entirely composed of silicon. In other embodiments, the semiconductor substrate 102 may include a multilayered semiconductor material stack including at least two different semiconductor materials, as defined above. In an embodiment, the multilayered semiconductor material stack may include, in any order, a stack of silicon and a silicon germanium alloy. In another embodiment, the semiconductor substrate 102 may include a single crystalline semiconductor material. Such single crystal materials may have any of the well-known crystal orientations. For example, the crystal orientation of the semiconductor substrate 102 may be {100}, {110}, or {111}. Other crystallographic orientations besides those specifically mentioned can also be used in the present application.

The semiconductor fins 104 are formed from the substrate 102, and form the channel region of the vertical transistor device depicted by the structure 100. First, masks 112 are deposited on the substrate 102. The masks 112 define regions for the semiconductor fins 104. The substrate 102 is etched or patterned using an anisotropic etch such as, for example, reactive ion etching, to remove material that is not covered by the masks 112 to form the semiconductor fins 104. Although the present application describes and illustrates forming two semiconductor fins 104, the same process may be used to form a single semiconductor fin, or more than two semiconductor fins.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each semiconductor fin 104 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each semiconductor fin 104 is spaced apart laterally from its nearest neighboring semiconductor fin 104 by a pitch ranging from approximately 20 nm to approximately 100 nm; the pitch is measured from one point, or reference surface, of one semiconductor fin to the exact same point, or reference surface, on a neighboring semiconductor fin. Also, the semiconductor fins 104 are generally oriented parallel to each other. Additionally, the fins 104 can be arranged end-to-end as illustrated and described below with reference to FIGS. 25-29.

In general, the bottom source drain regions 106 are arranged on the substrate 102 and between the fins 104. Specifically, in the illustrated embodiment, the bottom source drain regions 106 are epitaxially grown directly on top of the substrate 102 adjacent to the semiconductor fins 104 and subsequently patterned, if needed. In other embodiments, the bottom source drain regions 106 are epitaxially grown within trenches or recesses formed in the substrate 102. In yet another embodiment, the bottom source drain regions 106 are formed by doping an exposed surface of the substrate 102 using an ion implant technique.

It should be understood that the bottom source drain regions 106 may be either one of a source region or a drain region, as appropriate. Illustrative examples of suitable materials for the bottom source drain regions 106 include, but are not limited to, silicon, silicon germanium, carbon doped silicon germanium, and multi-layers thereof.

The bottom source drain regions 106 may be doped with dopant atoms. The bottom source drain regions 106 may be in-situ doped as they are grown or deposited on the substrate 102. The dopant atoms may be an n-type dopant or a p-type dopant. Exemplary n-type dopants include phosphorus, arsenic antimony for group IV semiconductors, and selenium, tellurium, silicon, and germanium for III-V semiconductors. Exemplary p-type dopants include beryllium, zinc, cadmium, silicon, germanium, for III-V semiconductors, and boron, aluminum, and gallium for group IV semiconductors. In an embodiment, for group IV semiconductors based device, the bottom source drain regions 106 are made from doped Si: (for n-type devices) or SiGe:B (for p-type devices), with dopant concentrations ranging from approximately $2\times10^{20}$ to approximately $2.5\times10^{21}$ atoms/cm$^2$, with a dopant concentration ranging from approximately $4\times10^{20}$ to approximately $1.5\times10^{21}$ atoms/cm$^2$ being more typical.

In another embodiment, the bottom source drain regions 106 may be formed from a III-V semiconductor. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present embodiments include, but are not limited to alloys of gallium arsenide, indium arsenide, indium antimonide, indium phosphide, aluminum arsenide, indium gallium arsenide, indium aluminum arsenide, indium aluminum arsenide antimonide, indium aluminum arsenide phosphorude, indium gallium arsenide phosphorude and combinations thereof. In an embodiment, the bottom source drain regions 106 are made from doped III-V semiconductor materials with dopant concentrations ranging from approximately $1\times10^{18}$ to approximately $1\times10^{20}$ atoms/cm$^2$, with a dopant concentration ranging from approximately $5\times10^{18}$ to approximately $8\times10^{19}$ atoms/cm$^2$ being more typical.

Next, RX patterning is applied to both the fins 104 and the bottom source drain regions 106 according to known techniques. In doing so, the length of the fins 104 are patterned flush, or substantially flush, with vertical edges of the bottom source drain regions 106, as illustrated in FIG. 3. In contrast, the fin length of conventional vertical transistor structures is typically defined prior to RX patterning of the bottom source drain regions 106. As such, the bottom source drain regions in a typical vertical transistor structure are typically longer, in the y-direction, than the fin and therefore limit how close fins can be positioned end-to-end. Because both the fins 104 and the bottom source drain regions 106 of the present embodiment are patterned simultaneously during RX patterning, the fins 104 can be positioned closer end-to-end, as further described below with reference to FIG. 26. Additionally, a vertical sidewall of the metal gate 116 is flush, or substantially flush, with a vertical sidewall of the bottom source drain region, as illustrated in FIG. 3.

The STI regions 108 penetrate, or extend below, the bottom source drain regions 106 and extend partially into the substrate 102. As illustrated, trenches formed during RX patterning are filled with a dielectric material to form the STI regions 108. The STI regions 108 may be formed from any appropriate dielectric including, for example, silicon oxide (SiO$_x$) or silicon nitride (Si$_x$N$_y$).

As is shown, the bottom spacers 110 contact sidewall surfaces of a lower portion of the semiconductor fins 104. The bottom spacers 110 have a height, or thickness, that is less than a height of each semiconductor fin 104. Stated differently, topmost surfaces of the bottom spacers 110 are vertically offset and located far beneath topmost surfaces of each mask 112, and beneath topmost surfaces of the semiconductor fins 104.

In the illustrated embodiment, the bottom spacers 110 are deposited on a top surface of the bottom source drain regions 106. It is specifically contemplated that the bottom spacers 110 are deposited in an anisotropic manner, without accumulation on the sidewalls of the semiconductor fins 104. This may be accomplished using, for example, gas cluster ion beam (GCIB) deposition, where the surface is bombarded by high-energy cluster ions. In alternative embodiments, other deposition techniques may be used to form the bottom spacers 110 only on the horizontal surfaces.

Alternatively, the bottom spacers 110 are formed by first depositing a blanket dielectric layer followed by a recess etch to remove a portion of the blanket dielectric layer. The recess etch removes a portion of the blanket dielectric layer until the bottom spacers 110 remains. In such cases, the chosen dielectric material is etched selective to the masks 112 and the semiconductor fins 104. In an example, when the blanket dielectric layer is silicon oxide (SiO$_x$) and the masks 112 are silicon nitride (Si$_x$N$_y$), a hydrofluoric acid or a buffered oxide etchant (i.e., a mixture of ammonium fluoride and hydrofluoric acid) may be used during the recess etch technique. In other embodiments, the masks 112 can be a composite structure made from multiple layers of different dielectrics.

Suitable spacer materials from which the bottom spacers 110 are formed include, but are not limited to, oxides such as silicon oxide ($SiO_x$), nitrides such as silicon nitride ($Si_xN_y$), and/or low-K materials such as carbon-doped oxide materials containing silicon (Si), carbon (C), oxygen (O), and hydrogen (H) (SiCOH) or siliconborocarbonitride (SiBCN). The term "low-K" as used herein refers to a material having a relative dielectric constant k which is lower than that of silicon dioxide.

Referring now to FIGS. 4 and 5, the structure 100 is shown after depositing a gate dielectric 114 and metal gate 116 in accordance with an embodiment of the present invention. FIG. 4 depicts a cross-sectional view of the structure 100 shown in FIG. 5 taken along line $X_1$-$X_1$, and FIG. 5 depicts a cross-sectional view of the structure 100 shown in FIG. 4 taken along line $Y_1$-$Y_1$.

In doing so, the gate dielectric 114 is conformally deposited directly on exposed surfaces of the fins 104, or channel, and the bottom spacers 110. As used herein, "conformal" it is meant that a material layer has a continuous thickness. For example, a continuous thickness generally means a first thickness as measured from a bottom surface to a topmost surface that is the same as a second thickness as measured from an inner sidewall surface to an outer sidewall surface. In another embodiment, the gate dielectric 114 may be a non-conformal layer.

The gate dielectric 114 is composed of a gate dielectric material. The gate dielectric 114 can be an oxide, nitride, and/or oxynitride. In an example, the gate dielectric 114 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaALO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials, e.g., silicon dioxide, and a high-k gate dielectric can be formed and used as the gate dielectric 114.

The gate dielectric 114 can be formed by any deposition technique including, for example, chemical vapor deposition (CVD), plasma enhanced chemical vapor deposition (PECVD), physical vapor deposition (PVD), sputtering, or atomic layer deposition. In an embodiment, the gate dielectric 114 can have a thickness in ranging from approximately 1 nm to approximately 10 nm. Other thicknesses that are lesser than, or greater than, the aforementioned thickness range can also be employed for the gate dielectric 114.

In an embodiment, the metal gate 116 is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In an embodiment, the work function of the n-type work function metal ranges from 4.1 eV to 4.3 eV. In an embodiment, the n-type work function metal is composed of at least one of TiAl, TaN, TIN, HfN, HfSi, or combinations thereof. The n-type work function metal can be formed using chemical vapor deposition atomic layer deposition, sputtering or plating.

In another embodiment, the metal gate 116 may be a p-type work function metal. As used herein, a "p-type work function metal" is a metal that effectuates a p-type threshold voltage shift. In an embodiment, the work function of the p-type work function metal ranges from 4.9 eV to 5.2 eV. As used herein, "threshold voltage" is the lowest attainable gate voltage that will turn on a semiconductor device, for example, transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In an embodiment, the p-type work function metal may be composed of titanium, titanium nitride or titanium carbide. The p-type work function metal may also be composed of TiAlN, Ru, Pt, Mo, Co and alloys and combinations thereof. In an embodiment, the p-type work function metal can be formed by, a physical vapor deposition method, such as sputtering, chemical vapor deposition or atomic layer deposition.

The metal gate 116 can be formed by any deposition technique including, for example, chemical vapor deposition (CVD), plasma enhanced chemical vapor deposition (PECVD), physical vapor deposition (PVD), sputtering, or atomic layer deposition. Like the gate dielectric 114, in some embodiments, the metal gate 116 is also a conformal layer. In an embodiment, the metal gate 116 can have a thickness in a ranging from approximately 1 nm to approximately 10 nm. Other thicknesses that are lesser than, or greater than, the aforementioned thickness range can also be employed for the used in providing the metal gate 116. It is critical to monitor and control forming of the metal gate 116 to prevent pinch off between adjacent devices, especially, in narrow-pitch configurations. As illustrated, the bottom spacers 110 separate the bottom source drain regions 106 from the metal gate 116.

Referring now to FIGS. 6 and 7, the structure 100 is shown after removing portions of the metal gate 116 and the gate dielectric 114 in accordance with an embodiment of the present invention. FIG. 6 depicts a cross-sectional view of the structure 100 shown in FIG. 7 taken along line $X_1$-$X_1$, and FIG. 7 depicts a cross-sectional view of the structure 100 shown in FIG. 6 taken along line $Y_1$-$Y_1$.

Horizontal portions of the metal gate 116 and the gate dielectric 114 can be selectively removed according to known techniques. For example, any suitable method, such as a wet etch, a dry etch, or a combination of sequential wet and/or dry etches can be used to selectively remove the horizontal portions of the metal gate 116 and the gate dielectric 114. More specifically, the metal gate 116 and the gate dielectric 114 are etched to expose topmost surfaces of the masks 112 and the bottom spacers 110, as illustrated. After etching, topmost surfaces of the metal gate 116 and the gate dielectric 114 are flush, or substantially flush, with a topmost surface of the masks 112. Furthermore, the remaining portions of the metal gate 116 and the gate dielectric 114 surround all sides of the fins 104, as illustrated.

Referring now to FIGS. 8 and 9, the structure 100 is shown after forming an interlevel dielectric layer 118 in accordance with an embodiment of the present invention. FIG. 8 depicts a cross-sectional view of the structure 100 shown in FIG. 9 taken along line $X_1$-$X_1$, and FIG. 9 depicts a cross-sectional view of the structure 100 shown in FIG. 8 taken along line $Y_1$-$Y_1$.

The interlevel dielectric layer 118 surrounds the structure shown in FIGS. 6 and 7. The interlevel dielectric layer 118 is composed of known interlevel dielectrics. The interlevel dielectric layer 118 may be composed of, for example, silicon oxide ($SiO_x$), undoped silicate glass (USG), fluorosilicate glass (FSG), borophosphosilicate glass (BPSG), a spin-on low-K dielectric layer, a chemical vapor deposition (CVD) low-K dielectric layer or any combination thereof. As indicated above, the term "low-K" as used herein refers to a material having a relative dielectric constant k which is lower than that of silicon dioxide.

In an embodiment, the interlevel dielectric layer 118 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. After deposition, a planarization technique such as, for example, chemical mechanical planarization (CMP) and/or grinding is applied. The planarization technique removes excess material of the interlevel dielectric layer 118 and continues polishing until the uppermost surfaces of the masks 112 are exposed. After polishing the uppermost surfaces of the masks 112 are flush, or substantially flush, with an uppermost surface of the interlevel dielectric layer 118. In another embodiment, interlevel dielectric layer 118 may include a self-planarizing material such as a spin-on glass (SOG) or a spin-on low-K dielectric material such as SiLK™. Doing so may avoid the need to perform a subsequent planarizing step.

Referring now to FIGS. 10, 11, and 12, the structure 100 is shown after patterning a photoresist layer 120 and subsequently transferring the pattern into underlying layers in accordance with an embodiment of the present invention. FIG. 10 depicts a cross-sectional view of the structure 100 shown in FIG. 12 taken along line $X_1$-$X_1$, FIG. 11 depicts a cross-sectional view of the structure 100 shown in FIG. 12 taken along line $X_2$-$X_2$, and FIG. 12 depicts a cross-sectional view of the structure 100 shown in FIG. 10 taken along line $Y_1$-$Y_1$.

The photoresist layer 120 is deposited and subsequently patterned to expose portions of the structure 100 as illustrated. Specifically, portions of the masks 112, the metal gate 116, the gate dielectric 114, and the interlevel dielectric layer 118 at one end of the fins 104 are exposed. Meanwhile, other portions of the masks 112, the metal gate 116, the gate dielectric 114, and the interlevel dielectric layer 118 at the other end of the fins 104 remain protected by the photoresist layer 120, as shown in FIG. 11.

Next, the portions of the masks 112, the metal gate 116, the gate dielectric 114, and the interlevel dielectric layer 118 exposed by patterning the photoresist layer 120 are selectively removed according to known techniques. For example, any suitable method, such as a wet etch, a dry etch, or a combination of sequential wet and/or dry etches can be used to selectively remove the portions of the masks 112, the metal gate 116, the gate dielectric 114, and the interlevel dielectric layer 118. Removing such portions of the masks 112, the metal gate 116, the gate dielectric 114, and the interlevel dielectric layer 118 create openings 122, as illustrated. After etching, a first portion (116a) of the metal gate 116 surrounding each fin 104 extends above the topmost surface of the fin while a second portion (116b) of the metal gate 116 surrounding each fin 104 is below the topmost surface of the fin. As described herein, the first portion (116a) of the metal gate 116 is considered a raised gate structure.

It is critical that etching fully recesses exposed portions of the metal gate 116 and the gate dielectric 114 below a topmost surface of the fins 104 in order to prevent shorts between the metal gate 116 and a subsequently formed top source drain region. Doing so will form divots 124 around the perimeter of the exposed portion of the fins 104, as illustrated. It is further important that etching fully exposes a portion of the topmost surface of the fins 104 to provide adequate contact area for the subsequently formed top source drain region, as described in more detail below.

Referring now to FIGS. 13, 14, and 15, the structure 100 is shown after removing the photoresist layer 120 and forming a dielectric layer 126 in accordance with an embodiment of the present invention. FIG. 13 depicts a cross-sectional view of the structure 100 shown in FIG. 15 taken along line $X_1$-$X_1$, FIG. 14 depicts a cross-sectional view of the structure 100 shown in FIG. 15 taken along line $X_2$-$X_2$, and FIG. 15 depicts a cross-sectional view of the structure 100 shown in FIG. 13 taken along line $Y_1$-$Y_1$.

First, the photoresist layer 120 is removed according to known techniques. Next, the dielectric layer 126 is conformally deposited directly on exposed surfaces of the structure 100. More specifically, the dielectric layer 126 is conformally deposited within the openings 122, as illustrated.

According to embodiments of the present invention, the dielectric layer 126 is composed of a common spacer or dielectric material used for isolating adjacent conductive structures. For example, the dielectric layer 126 can be an oxide, nitride, and/or oxynitride. In an embodiment, the dielectric layer 126 is silicon nitride. The dielectric layer 126 should be deposited with a sufficient thickness to completely fill, or "pinch-of" the divots 124.

Referring now to FIGS. 16, 17, and 18, the structure 100 is shown after removing portions of the dielectric layer 126 in accordance with an embodiment of the present invention. FIG. 16 depicts a cross-sectional view of the structure 100 shown in FIG. 18 taken along line $X_1$-$X_1$, FIG. 17 depicts a cross-sectional view of the structure 100 shown in FIG. 18 taken along line $X_2$-$X_2$, and FIG. 18 depicts a cross-sectional view of the structure 100 shown in FIG. 16 taken along line $Y_1$-$Y_1$.

Horizontal portions of the dielectric layer 126 are selectively removed to expose topmost surfaces of the fins 104 and form top spacers 128 according to known techniques. For example, any suitable method, such as a wet etch, a dry etch, or a combination of sequential wet and/or dry etches can be used to selectively remove the horizontal portions of the dielectric layer 126.

After etching, topmost surfaces of the top spacers 128 are flush, or substantially flush, with topmost surfaces of the masks 112. Again, it is critical that etching fully exposes a portion of the topmost surface of the fins 104 to provide adequate contact area for a top source drain region, as described below.

Referring now to FIGS. 19, 20, and 21, the structure 100 is shown after forming top source drain regions 130 in accordance with an embodiment of the present invention. FIG. 19 depicts a cross-sectional view of the structure 100 shown in FIG. 21 taken along line $X_1$-$X_1$, FIG. 20 depicts a cross-sectional view of the structure 100 shown in FIG. 21 taken along line $X_2$-$X_2$, and FIG. 21 depicts a cross-sectional view of the structure 100 shown in FIG. 19 taken along line $Y_1$-$Y_1$.

The top source drain regions 130 are formed directly on the topmost surfaces of the fins 104 exposed by forming the top spacers 128 according to known techniques. As such, the top source drain regions 130 directly contact exposed topmost surfaces of the fins 104. Meanwhile, the top spacers 128 physically separate the top source drain regions 130 from the metal gate 116 and the gate dielectric 114, for example in the divot 124. Of note, topmost surfaces of the top source drain regions 130 are flush, or substantially flush, with the topmost surfaces of the masks 112, the top spacers 128, the gate dielectric 114, and the metal gate 116. As previously described, the first portion (116a) of the metal gate 116 surrounding each fin 104 extends above the topmost surface of the fins 104 while a second portion (116b) of the metal gate 116 surrounding each fin 104 is below the topmost surface of the fins 104.

The top source drain regions 130 can be epitaxially grown from exposed surfaces of the fins 104 using conventional techniques similar to the bottom source drain regions 106. Additionally, the top source drain regions 130 can be formed from similar materials and similar dopant concentrations as bottom source drain regions 106. In the present embodiment, the top source drain regions 130 should be grown to completely fill the openings 122. In the present application, it should be noted the top source drain regions 130 are grown directly from exposed surfaces of the fins 104 adjacent to the masks 112, whereas conventional techniques would normally remove the masks 112 prior to forming the top source drain regions 130. In this case, at least a portion of the masks 112 remain and function as a buffer or placeholder for subsequent processing. Additionally, the process may include overgrowing the top source drain regions 130 above a top surface of the interlevel dielectric layer 118, after which any excess material will be removed by a subsequent chemical mechanical planarization technique. At this stage of fabrication, the top source drain regions 130 do not undergo a high temperature anneal in order to preserve the integrity of the metal gate 116.

In most cases, polishing will result in the top source drain regions 130 and the top spacers 128 to be slightly recessed below the topmost surface of the metal gate, specifically the topmost surface of the first portion 116a of the metal gate 116. As such, a topmost surface of the metal gate (116a) is higher than the top spacer 128 and higher than the top source drain region 130. Alternatively, a recess technique can be applied to further reduce the overall height of the top source drain regions 130 and the top spacers 128 and thereby lower resistance between the channel (i.e. fins) and a subsequently formed source drain contact.

Referring now to FIGS. 22, 23, and 24, the structure 100 is shown after forming contact structures including gate contacts 132 and top source drain contacts 134 in accordance with an embodiment of the present invention. FIG. 22 depicts a cross-sectional view of the structure 100 shown in FIG. 24 taken along line $X_1$-$X_1$, FIG. 23 depicts a cross-sectional view of the structure 100 shown in FIG. 24 taken along line $X_2$-$X_2$, and FIG. 24 depicts a cross-sectional view of the structure 100 shown in FIG. 22 taken along line $Y_1$-$Y_1$.

First, a second interlevel dielectric layer 136 is deposited on the structure 100. Next, contact trenches are formed in the second interlevel dielectric layer 136, which exposes upper surfaces of at least the metal gate 116 and the top source drain regions 130. Finally, the contact trenches are filled with a conductive material to form the contact structures (132, 134). The contact structures (132, 134) can be formed by depositing a conductive material in the contact trench. As such, in at least an embodiment, the conductive material of the contact structures (132, 134) is deposited directly on exposed upper surfaces of the metal gate 116 and the top source drain regions 130. Specifically, the conductive material deposited directly on exposed upper surfaces of the metal gate 116 form the gate contacts 132, and the conductive material deposited directly on exposed upper surfaces of the top source drain regions 130 form the top source drain contacts 134.

The contact structures (132, 134) may include any suitable conductive material, such as, for example, copper, aluminum, tungsten, cobalt, or alloys thereof. Examples of deposition techniques that can be used in providing the spacer material include, for example, chemical vapor deposition (CVD), plasma enhanced chemical vapor deposition (PECVD), or atomic layer deposition (ALD). In some cases, an electroplating technique can be used to form the contact structures (132, 134).

After deposition, a planarization technique such as, for example, chemical mechanical planarization (CMP) and/or grinding is applied. The planarization technique removes excess conductive material of the contact structures (132, 134) from above the second interlevel dielectric layer 136. After polishing, upper surfaces of the contact structures (132, 134) are flush, or substantially flush, with upper surface of the second interlevel dielectric layer 136.

As illustrated in FIGS. 22-24, the vertical transistor structure represented by the structure 100 in this example has some distinctive notable features. For instance, the structure 100 includes the raised gate structure (i.e. the first portion 116a of the metal gate 116) which extends vertically above the active regions (i.e. the fins 104 or the channel). The structure 100 further includes the gate contact 132 positioned entirely above the active regions (i.e. the fins 104 or the channel). In some embodiments, at least a portion of the gate contact 132 is directly above, and overlaps, at least a portion of the fins 104.

As previously discussed, the remaining portion of the masks 112 function as a buffer and allow the gate contact 132 to land on the metal gate 116 without shorting to the top source drain regions 130. In contrast, if the masks 112 were removed entirely, the gate contact 132 would very likely short to the top source drain regions 130. As such, persons having ordinary skill in the art recognize the design flexibility in the amount of the masks 112 that remains to maximize function and prevent shorts.

Additionally, both the remaining portions of the mask 112 and a remaining portion of the top spacers 128 serve as a composite spacer which laterally separates a first portion (116a) of the metal gate 116 (i.e the raised gate structure) from the top source drain region 130, as illustrated in FIG. 24. The composite spacer (112, 128) further enables the gate contact 132 to land on the metal gate 116 without shorting to the top source drain regions 130. Meanwhile, another remaining portion of the top spacers 128 vertically separates the second portion (116b) of the metal gate 116 from a bottom most surface of the top source drain region 130, also as illustrated in FIG. 24.

Figure 28:
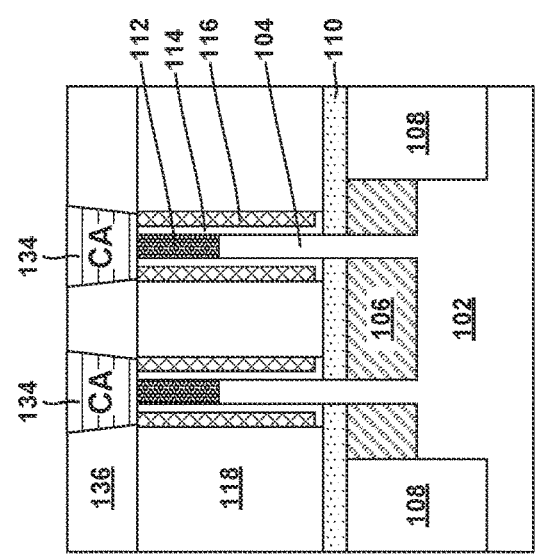

Referring now to FIGS. 25, 26, 27, 28, and 29 a structure 200 is shown according to an alternative embodiment of the invention. FIG. 25 depicts a cross-sectional view of the structure 100 shown in FIG. 26 taken along line $X_1$-$X_1$, FIG. 26 depicts a cross-sectional view of the structure 100 shown in FIG. 25 taken along line $Y_1$-$Y_1$, FIG. 27 depicts a cross-sectional view of the structure 100 shown in FIG. 26 taken along line $X_2$-$X_2$. FIG. 28 depicts a cross-sectional view of the structure 100 shown in FIG. 26 taken along line X₃-X₃, and FIG. 29 depicts a cross-sectional view of the structure 100 shown in FIG. 25 taken along line Y₂-Y₂.

The structure 200 is substantially similar to the structure 100 described above and is produced by the same process flow described above with respect to the structure 100. Instead, the structure 200 provides a more elaborate illustration of a final structure. Specifically, the structure 200 includes multiple fins arranged both side-by-side and end-to-end. In such arrangements, the structure 200 benefits from a shared gate contact 132, as illustrated in FIG. 26. The individual transistors illustrated in the structure 200 may include any combination of N-type or P-type transistors.

As illustrated in FIGS. 25-29, the vertical transistor structure represented by the structure 200 in this example has some distinctive notable features. Like the structure 100, the structure 200 includes the raised gate structure (i.e. the first portion 116*a* of the metal gate 116) which extends vertically above the active regions (i.e. the fins 104 or the channel). Also, like the structure 100, the structure 200 includes the gate contact 132 positioned entirely above the active regions (i.e. the fins 104 or the channel). In contrast, the gate contact of conventional vertical transistor structures typically extends down between adjacent fins. In some embodiments, at least a portion of the gate contact 132 is directly above, and overlaps, a portion of at least one of the two fins 104, as illustrated in FIGS. 26 and 29.

Specifically, the structure 200 has a reduced cell height relative to conventional vertical transistor structures. The reduced cell height is achieved by (a) etching the fins and the bottom source drains during RC patterning and (b) the raised gate structure (116*a*).

First, etching the fins and the bottom source drains during RC patterning can save approximately 5-10 nm. For example, conventional RX patterning produces a fin length that is 5-10 nm shorter than a length of the bottom source drain region. According to embodiments of the present embodiment, the fin and the bottom source drain will have a substantially similar, in not the same, length. As such, the two fins of the structure 200 (FIG. 26) arranged end-to-end, can be positioned 5-10 nm closer together without any detrimental effects.

Second, implementing the raise gate structure disclosed herein eliminates the extra space end-to-end required for a conventional gate contact. Said differently, because the structure 200 does not require a conventional gate structure extending down between adjacent fin ends, the adjacent fins can be positioned closer together, thereby reducing the overall cell height.

Figure 30:
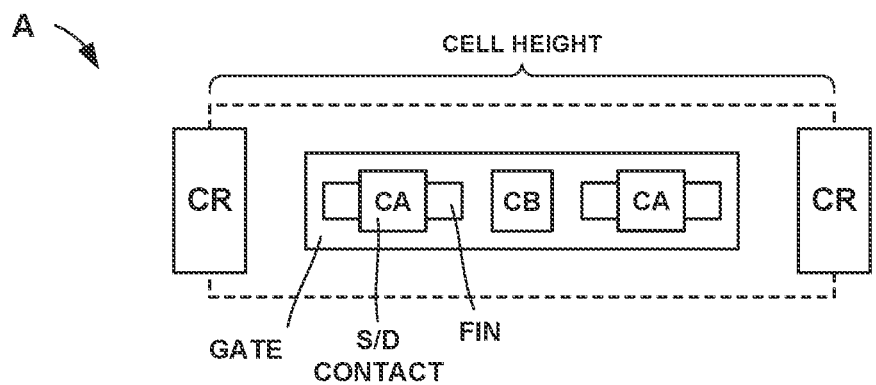
FIGS. 30 and 31 depict multiple design layouts according to exemplary embodiments.
Figure 31:
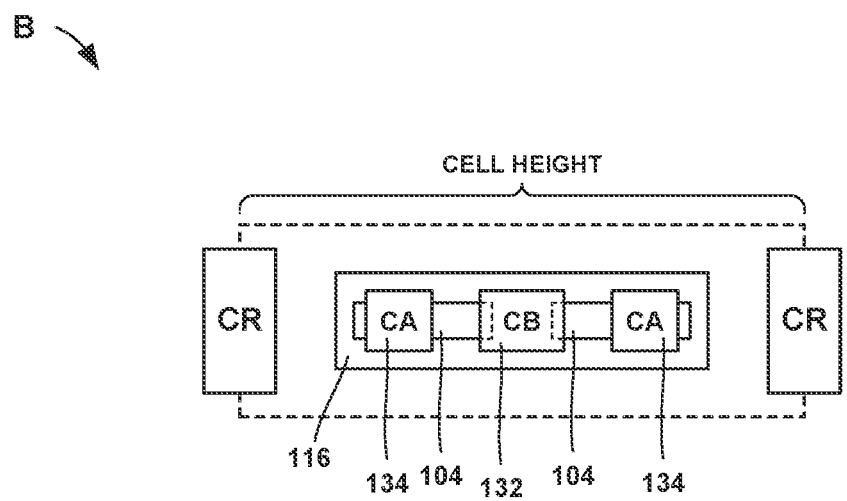

Referring now to FIGS. 30 and 31, multiple design layouts are depicted according to embodiments of the invention. FIG. 30 depicts design layout A representative of a typical configuration. FIG. 31 depicts design layout B corresponding to the structure 200 described above. A relative position of the fins 104, the gate contact 132 (CB), the top source drain contacts 134 (CA), and the bottom source drain contacts (CR) are shown in each of the design layouts depicted. Additionally, a representative "cell height" is depicted for each.

In design layout A, the gate contact 132 (CB) is typically positioned between adjacent fins. Such configurations require a minimum spacing between fins to accommodate the gate contact 132 (CB) and any necessary insulator, such as a dielectric spacer (not shown). Such configurations have a relatively large cell height, where the cell height is generally measured parallel with the fins from one end of the transistor device to the other end of the transistor device. In the present example, the cell height of a single vertical device is measured from one bottom source drain contacts (CR) to another.

In contrast, and in accordance with embodiments of the present invention, the cell height of the vertical transistor device of design layout B is less than the cell height of the vertical transistor device of design layout A. This is made possible by the novel process and structures disclosed herein with respect to the structure 100 and the structure 200. Specifically, the reduced cell height is achieved by (a) etching the fins and the bottom source drains during RC patterning and (b) the raised gate structure (116*a*).

For example, etching the fins and the bottom source drains during RC patterning can save 5-10 nm, and forming the gate contact above the raised gate structure can save another 5-10 nm, as previously described above with reference to FIGS. 25-29. As such, the cell height of the vertical transistor device of design layout B can be as much as 50 nm less than the cell height of the vertical transistor device of design layout A.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
    a vertical semiconductor channel region;
    a bottom source drain region arranged on a substrate at a bottom of the vertical semiconductor channel region;
    a metal gate disposed around the vertical semiconductor channel region, wherein a first portion of the metal gate is above the vertical semiconductor channel region; and
    a gate contact entirely above the vertical semiconductor channel region, wherein a portion of the gate contact is directly above a portion of the vertical semiconductor channel region.

2. The semiconductor structure according to claim 1, further comprising:
    a composite spacer laterally separating the first portion of the metal gate from a top source drain region.

3. The semiconductor structure according to claim 1, further comprising:
    a spacer vertically separating a second portion of the metal gate from a bottom most surface of a top source drain region.

4. The semiconductor structure according to claim 1, wherein a second portion of the metal gate is below a topmost surface of the vertical semiconductor channel region.

5. The semiconductor structure according to claim 1, wherein a vertical sidewall of the metal gate directly below the gate contact is substantially flush with a vertical sidewall of the bottom source drain region.

6. A semiconductor structure comprising:
    a vertical semiconductor channel region;
    a bottom source drain region arranged on a substrate at a bottom of the vertical semiconductor channel region;
    a metal gate disposed around the vertical semiconductor channel region; and a top source drain region above the vertical semiconductor channel region, wherein a topmost surface of the metal gate is substantially flush with a topmost surface of the top source drain region.

7. The semiconductor structure according to claim 6, further comprising:
a composite spacer laterally separating the metal gate from the top source drain region.

8. The semiconductor structure according to claim 6, further comprising:
a gate contact entirely above the vertical semiconductor channel region and directly contacting the topmost surface of the metal gate.

9. The semiconductor structure according to claim 6, further comprising:
a gate contact above the vertical semiconductor channel region, wherein a portion of a gate contact is directly above a portion of the vertical semiconductor channel region.

10. The semiconductor structure according to claim 6, wherein a first portion of the metal gate is above a topmost surface of the vertical semiconductor channel region and a second portion of the metal gate is below the topmost surface of the vertical semiconductor channel region.

11. The semiconductor structure according to claim 6, wherein vertical sidewalls at opposite ends of the vertical semiconductor channel region are substantially flush with vertical sidewalls of the bottom source drain region.

12. A semiconductor structure comprising:
two vertical semiconductor channel regions aligned and arrange end-to-end;
a bottom source drain region arranged on a substrate at a bottom of each of the two vertical semiconductor channel regions;
a metal gate disposed around the two vertical semiconductor channel regions, wherein a first portion of the metal gate situated between the two vertical semiconductor channel regions extends above the two vertical semiconductor channel regions; and
a single gate contact entirely above the two vertical semiconductor channel regions, wherein at least a portion of the single gate contact is directly above at least a portion of the two vertical semiconductor channel regions.

13. The semiconductor structure according to claim 12, further comprising:
a composite spacer laterally separating the first portion of the metal gate from a top source drain region.

14. The semiconductor structure according to claim 12, further comprising:
a spacer vertically separating a second portion of the metal gate from a bottom most surface of a top source drain region.

15. The semiconductor structure according to claim 12, wherein a second portion of the metal gate is below a topmost surface of the two vertical semiconductor channel regions.

16. The semiconductor structure according to claim 12, wherein a vertical sidewall of the metal gate directly below the single gate contact is substantially flush with a vertical sidewall of the bottom source drain region.

* * * * *